July 16, 1968 M. R. BARBER ET AL 3,393,375

CIRCUITS FOR COMBINING THE POWER OUTPUTS OF A PLURALITY OF NEGATIVE RESISTANCE DEVICE OSCILLATORS

Filed Oct. 14, 1966 2 Sheets-Sheet 1

INVENTORS M.R. BARBER
H. FUKUI

BY R.B. Anderson
ATTORNEY

United States Patent Office 3,393,375
Patented July 16, 1968

3,393,375
CIRCUITS FOR COMBINING THE POWER OUTPUTS OF A PLURALITY OF NEGATIVE RESISTANCE DEVICE OSCILLATORS

Mark R. Barber, Summit, and Hatsuaki Fukui, Murray Hill, N.J., assignors to Bell Telephone Laboratories, Incorporated, Berkeley Heights, N.J., a corporation of New York Filed Oct. 14, 1966, Ser. No. 586,890
11 Claims. (Cl. 331—107)

ABSTRACT OF THE DISCLOSURE

Circuits are disclosed for forming and combining the pulsed outputs of intermittently operated oscillator elements to give a single, essentially contiuous wave output. In one embodiment of the invention, a plurality of negative resistance diodes are connected in parallel to a transmission line that includes a time delay device between each diode. To the transmission line are applied input drive pulses each of which have a duration that is approximately equal to the delay period of each time delay device. Because of the time delay, each drive pulse successively biases each diode beyond its oscillation threshold, thereby causing each succeeding diode to oscillate just as the preceding diode is cut off. The output of each of the diodes is frequency locked by a synchronous signal successively applied to the diodes so that the generated output of each diode is in phase with the output of the preceding diode. And the outputs of all the diodes are combined by suitable interconnections. Consequently, the diodes together deliver a single high frequency wave to the load.

This invention relates to oscillator circuits, and more particularly, to circuits for combining the outputs of a plurality of negative resistance device oscillators into a substantially continuous wave output.

One of the most promising of the new solid state devices is the bulk semiconductor diode, a negative resistance device that is capable of generating microwave frequency oscillations. Bulk diodes consist only of a small wafer of bulk semiconductor material, having particular energy band characteristics, which is included between opposite ohmic contacts. The device may be operated to produce microwave oscillations in either the so-called "Gunn-effect" mode as first described in the paper "Instabilities in III–V Semiconductors," by J. B. Gunn, IBM Journal of Research and Development, vol. 8, No. 2, pages 141–159, April 1964, or in the LSA (for limited space-charge accumulation) mode as described in the application of J. A. Copeland III, Ser. No. 564,081, filed July 11, 1966, and assigned to Bell Telephone Laboratories, Incorporated. A bulk semiconductor diode connected to an appropriate microwave tank circuit will generate oscillations in the gigahertz (kilomegacycles per second) range if biased by either a pulsed or a continuous current source above a characteristic threshold voltage.

Because of internal heating effects, bulk semiconductor diodes presently are capable of generating high power microwave frequency outputs only if they are operated intermittently. For example, gallium arsenide bulk diodes having semiconductor resistivities of 0.5 to 5 ohm-centimeters are typically capable of generating 5 watts of power at 6 gigahertz only for a .5 microsecond duration followed by a cooling period of 20 microseconds. If the device is to be operated continuously, the resistivity of the wafer should be on the order of 100 ohm-centimeters to prevent overheating; this reduces device efficiency and the maximum attainable output power is typically only in the milliwatt range. Another disadvantage of continuously operated bulk diodes is the difficulty of marking high resistivity bulk material with the uniformity and consistency required for predictable operation.

We have overcome many of these problems by devising a circuit for combining the pulsed outputs of intermittently operated oscillator elements to give a single essentially continuous wave output. In one embodiment of the invention, a plurality of the negative resistance diodes are connected in parallel to a transmission line which includes a time delay device between each diode. Input drive pulses are applied to the transmission line which each have a duration that is approximately equal to the delay period of each time delay device. The drive pulse biases each diode beyond its oscillation threshold to cause successive diodes to oscillate just as the previous diode is cut off. A synchronizing signal applied to the succesively triggered diodes frequency locks them so that the generated output of each diode is in phase with the output of the preceding diode. The diodes are connected by a common interconnection to a load and together deliver a single high frequency wave to the load. As will be described later, the output wave can be frequency modulated by frequency modulating the synchronizing signal.

These and other objects, features, and advantages of the invention will be better understood from a consideration of the following detailed description, taken in conjunction with the accompanying drawing in which.

Figure 1:
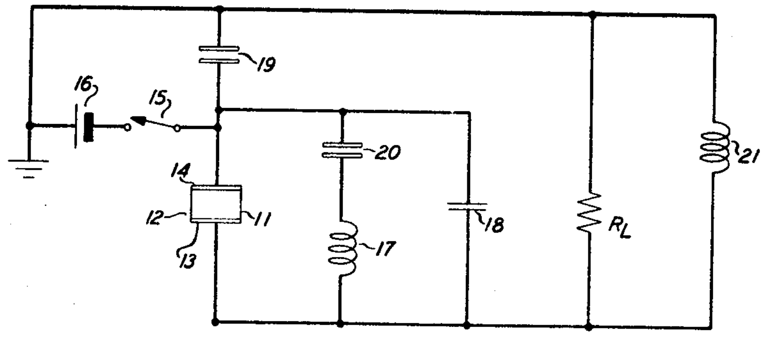
PRIOR ART FIG. 1
FIG. 1 is a schematic diagram of a negative resistance diode oscillator circuit of the prior art.

Referring now to FIG. 1 there is shown a typical microwave oscillator circuit of the prior art comprising a bulk semiconductor diode 11 consisting of a wafer 12 of bulk semiconductor material such as gallium arsenide to which are bonded ohmic contacts 13 and 14. When a switch 15 is closed, a bias voltage from a battery 16 is applied across the wafer which induces a transfer of carriers from a high mobility main conduction energy band to a higher energy low mobility band which, as is known, creates within the wafer a negative differential bulk resistance. Resulting instabilities within the wafer cause it to oscillate at a frequency determined by the wafer and by a tank circuit comprising an inductor 17 and a capacitor 18. Bypass capacitors 19 and 20 prevent the battery 16 from being short circuited to ground, while a radio-frequency choke 21 keeps the generated R-F current from being short circuited. The bypass capacitors are shown as being large to indicate that they have a negligible effect on the R-F oscillations which are therefore directed through the load resistor $R_L$.

The oscillator typically generates an output in the gigahertz range, and accordingly, microwave circuit components are used for performing the functions shown by the schematic diagram. The diode is capable of generating a high power output only if it is made with low resisitivity material and if it is biased beyond its threshold of oscillation only intermittently. For high power outputs, the switch 15 is therefore typically operated to give a bias pulse of a half microsecond duration with a cooling period between each pulse of about 20 microseconds.

Figure 2:
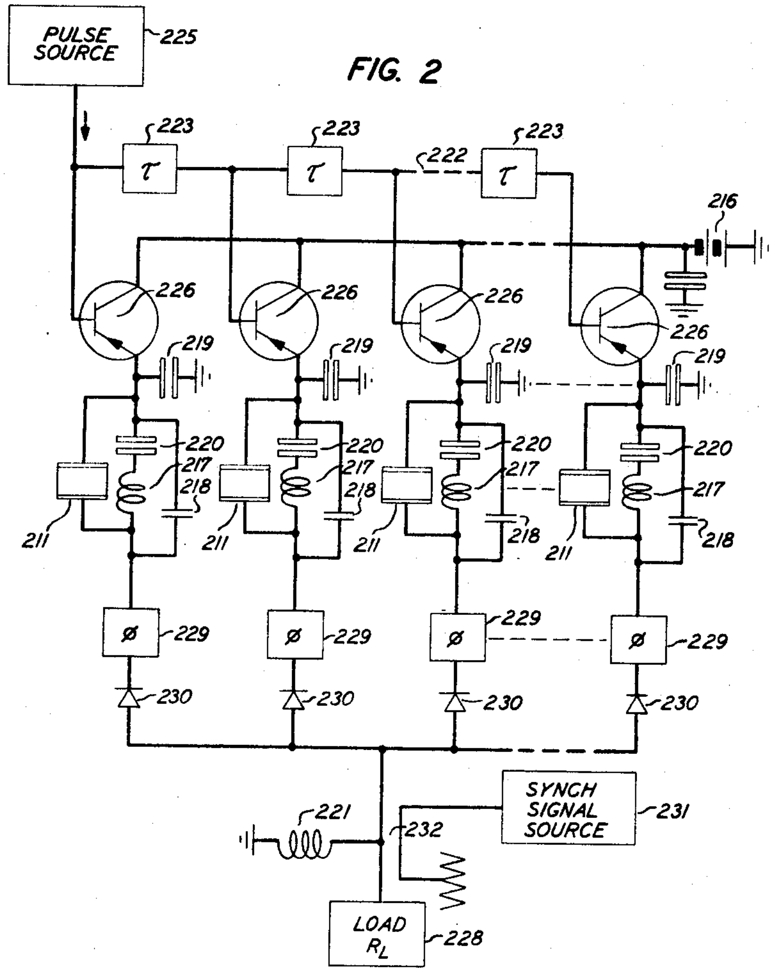
FIG. 2 is a schematic diagram of one embodiment of the invention.

Referring to FIG. 2, there is shown a circuit in accordance with one embodiment of the invention for combining the outputs of a number of pulsed diodes 211. The diodes are connected in parallel to a transmission line 222 which includes a separate time delay device 223 connected between each of the diode connections. A pulse source 225 connected to transmission line 222 applies drive pulses each of which is sequentially amplified by transistor 226 to bias a corresponding diode 211 at a voltage above its threshold of oscillation. Each diode is connected to a tank circuit comprising an inductor 217 and a capacitor 218 which correspond in function to the inductor 17 and capacitor 18 of FIG. 1, and to an R-F bypass capacitor 220 that corresponds to capacitor 20 of FIG. 1. The diode circuits are connected to a load 228 through variable phase shifters 229 and gate diodes 230. A radio-frequency choke 221 provides a direct current path to ground that corresponds to the choke 21 of FIG. 1, while a bypass capacitor 219 connected to the battery 216 corresponds to the capacitor 19 of FIG. 1.

The time duration of each input drive pulse is approximately equal to the time delay of each of the time delay devices 223, and the time separation between successive drive pulses is approximately equal to the total time delay of all the time delay devices. As a result, at any given time, a bias voltage is being applied to one of the diodes 211 and so a continuous R-F output is delivered to the load 228. As each of the diode oscillators is operating, low power R-F energy from a synchronizing signal source 231 is delivered to the oscillator by way of a directional coupler 232. The synchronizing signal frequency is within the frequency band of each of the tank circuits and is of appropriate magnitude to frequency lock each of the oscillators. The phase shifters 229 are adjusted to compensate for differences in transmission line length so that each of the oscillator circuits is the same number of wavelengths from the load. With these provisions, the successive outputs of the individual oscillators combine in phase to deliver a continuous uninterrupted R-F output to the load.

In operation, the first input drive pulse is amplified by the first transistor 226 to bias the first diode 211 at a voltage beyond its threshold of oscillation. It also forward biases the first gate diode 230 to permit synchronizing signal energy from source 231 to flow to the oscillator circuit to lock it at the frequency of the synchronizing signal. During the duration of the input drive pulse, the oscillator generates R–F power that is free to flow through the forward biased conducting diode 230 to the load 228. The remaining diodes 230 are not forward biased, are non-conducting, and therefore prevent R-F power from flowing to the unexcited oscillator circuits. At the end of the duration of the drive pulse, the first diode 211 cuts off, but by that time, the first driving pulse has proceeded through the first time delay device 223 to the second diode oscillator circuit of the series, and so the second oscillator starts to generate an output at the instant the first oscillator cuts off. As before, the drive pulse also forward biases the second gate diode 230 to permit the synchronizing signal to flow to the oscillator circuit and to permit the output of the oscillator circuit to flow to the load. This process is sequentially repeated until the last diode of the array has been excited. As the last diode is cut off, the succeeding driving pulse excites the first diode to maintain the continuous output to the load.

The design of each of the diodes 211 and its associated tank circuit to be resonant at a frequency which is consistent with that of the common synchronizing signal source 231 is within the skill of the worker in the art. An oscillator circuit will be frequently locked by a synchronizing signal if the magnitude of the synchronizing signal conforms to the relationship $$\frac{P_{sync}}{P_{out}}=Q^2\left(\frac{\Delta\omega_{max}}{\omega}\right)^2 \qquad (1)$$

where $P_{sync}$ is the power of the synchronizing signal, $P_{out}$ is the output power of the oscillator circuit, Q is the figure of merit of the oscillator circuit, $\omega$ is the frequency of the synchronizing signal, and $\Delta\omega_{max}$ is the maximum deviation of the resonant frequency of the oscillator from the synchronizing frequency $\omega$. The figure of merit Q is determined by the relationship $$Q=\omega C_{R-F}R_L \qquad (2)$$

where $C_{R-F}$ is the capacity of the radio-frequency capacitor 218 of the circuit (the bypass capacitor 219 and 220 are sufficiently large to be effective short circuits with respect to R-F energy and $R_L$ is the load resistance. By designing all of the oscillator circuits to conform with these relationships, they will all be frequency locked to a common source and will therefore deliver power of a common phase to the load as described before. Typically the synchronizing signal frequency can be 3 or 4 percent away from the center resonant frequency of any of the oscillator circuits and still frequency lock the oscillator circuit. In circuits that we have built, we have also found that it is preferable to make the time duration of each driving pulse just slightly larger than the time delay of each of the delay devices 223 so that there is a slight overlap of the outputs of successive oscillators. This helps to maintain a continuous output amplitude during the "build-up" period of each successive oscillator after it has been initially triggered.

Since the apparatus is intended to operate at microwave frequencies, printed circuit techniques can be used for making strip transmission lines for transmitting the energy as shown. The drawing of the directional coupler 232 is intended to be indicative of a conventional strip line directional coupler. If the R-F output power of the diode oscillators is relatively small, the rectifying diodes 230 are preferably Shottky barrier diodes which have a negligible resistance over rather large R-F voltage swing. PIN diodes are preferable if higher output powers are generated because the conductivity of such diodes is determined entirely by D-C bias rather than R-F voltage changes.

Figure 3:
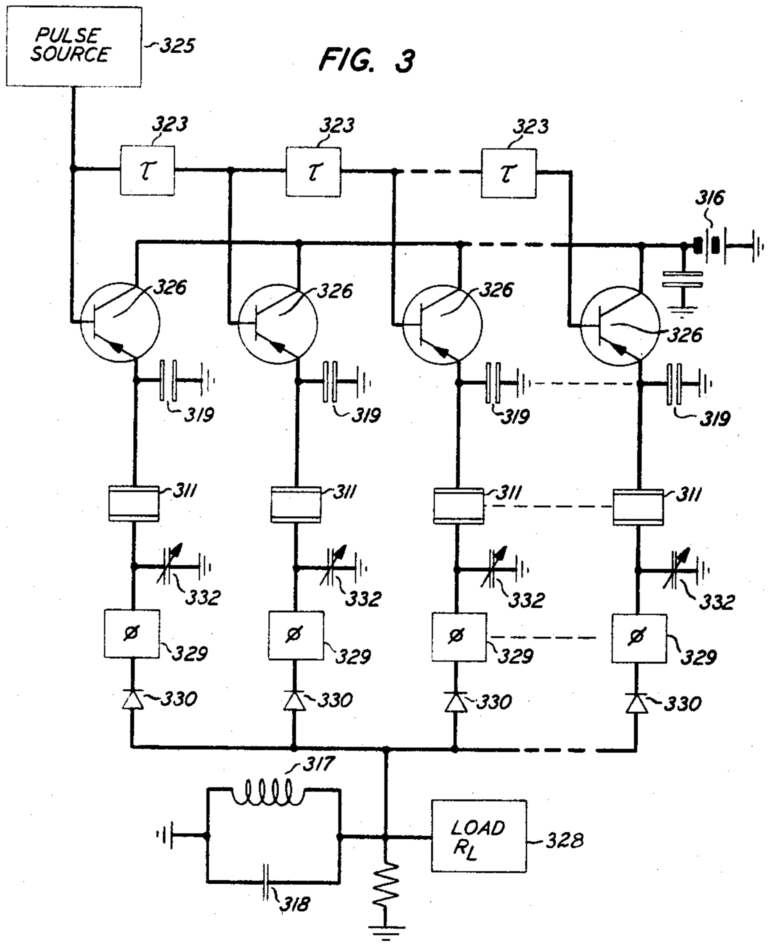
FIG. 3 is a schematic diagram of another embodiment of the invention.

Referring now to FIG. 3, there is shown another embodiment of the invention having components in the 300 series which correspond to the components of the 200 series of FIG. 2; for example, diodes 311 correspond with diodes 211 of FIG. 2, and phase shifters 329 correspond with the FIG. 2 phase shifters 229. As in FIG. 2, pulses from pulse source 325 sequentially trigger the diodes 311 so that they together deliver a continuous output to the load 328. Each input drive pulse also sequentially forward biases the diodes 330 so that the output from each oscillator element is limited to the load.

Unlike the circuit of FIG. 2, all of the diodes 311 are connected to a common tank circuit comprising inductor 317 and capacitor 318. When the first diode 311 is biased beyond its threshold, its generated energy oscillates in the tank circuit in the same manner as in the circuit of FIG. 1. When the second diode in the series is triggered, stored energy in the tank circuit is reflected back to the second diode and frequency locks it at the same phase and frequency as the first diode. Hence, the tank circuit of FIG. 3 can be considered as constituting a synchronizing signal source which performs the same function as source 231 of FIG. 2. Since the same tank circuit is common to all the diodes, so that the resonant frequency of all of the diode oscillator elements is nearly the same, only a small amount of the signal synchronizing power need be stored and reflected to the successive diodes for frequency locking in accordance with Equation 1. The frequencies of the diode oscillator units can be made exactly the same by means of the trimming capacitors 332 which compensate for differing diode capacitances.

Figure 4:
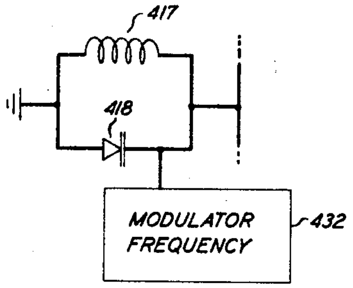
FIG. 4 is a schematic diagram of an alternative tank circuit that can be used in the embodiment of FIG. 3.

If so desired, the frequency of the synchronizing signal source can be varied to give a frequency modulated output, in which case the oscillator circuit can be considered to be a power amplifier. For example, in FIG. 2, if the synchronizing signal frequency is varied or modulated within a range that is consistent with Equation 1, the output delivered to the load will include the same frequency modulation, but of a higher power. The circuit of FIG. 3 can be modified as shown in FIG. 4 to vary the capacitance and therefore the resonant frequency of the tank circuit for generating a variable frequency output. This is preferably done by using as the variable capacitance a varactor diode 418, and using a modulation frequency source 432 to vary the capacitance of the varactor. As in the circuit of FIG. 3, the tank circuit will frequency lock the various diodes to give a continuous uninterrupted output to the load.

As mentioned before, the invention permits full advantage to be taken of the high power and high frequency capabilities of pulsed bulk semiconductor diodes. For example, in either of the circuits of FIGS. 2 and 3, 40 to 50 bulk semiconductor diodes can each be triggered for a half microsecond and allowed to cool for 20 to 25 microseconds. The invention can, however, be used with other negative resistance elements. In particular, avalanche diodes of the type described in the paper "A Proposed High Frequency Negative-Resistance Diode," by W. T. Read, Bell System Technical Journal, vol. 37, No. 2, page 401, March 1958, could be used in the circuits described, since, like bulk semiconductor diodes, avalanche diodes are capable of delivering much higher power outputs on a pulsed basis than on a continuous basis. Various other modifications and embodiments other than those shown and described may be made by those skilled in the art without departing from the spirit and scope of the invention.

What is claimed is:

1. A continuous-wave oscillator circuit comprising:
a plurality of parallel connected negative resistance elements each capable of generating a high frequency output within a predetermined frequency band in response to a bias voltage, and each having first and second terminals;
means forming a circuit path comprising a plurality of time delay means each connected between adjacent first terminals;
means for sequentially biasing the negative resistance elements and causing them to generate a high frequency output comprising a source of driving pulses connected to the circuit path;
and means for generating a low power synchronizing signal of a frequency within the frequency band of each of the negative resistance elements comprising a synchronizing signal source;
the second terminals of the elements being coupled to the synchronizing signal source and to a load.

2. The oscillator of claim 1 wherein:
the electrical phase at which output high frequency energy from each of the negative resistance elements arrives at the load is substantially identical.

3. The oscillator of claim 2 wherein:
each of the negative resistance elements is connected to a tank circuit having a bandwidth of resonance which includes the synchronizing signal frequency.

4. The oscillator circuit of claim 3 wherein:
all of the time delay devices have substantially the same time delay characteristics;
and the time duration of each of the driving pulses is approximately equal to the time delay period of each time delay device.

5. The oscillator circuit of claim 4 wherein:
the time separation between successive driving pulses is approximately equal to the sum of the time delay periods of all of the time delay devices.

6. The oscillator circuit of claim 5 wherein:
the ratio of the synchronizing signal power $P_{sync}$ delivered to each negative resistance element to the high frequency power output $P_{out}$ of each negative resistance element is related to the figure of merit Q of the tank circuit to which the negative resistance element is connected, the frequency $\omega$ of the synchronizing signal, and the maximum deviation $\Delta\omega_{max}$ of the negative resistance element output frequency from the synchronizing signal frequency by the relationship, $$\frac{P_{sync}}{P_{out}}=Q^2\left(\frac{\Delta\omega_{max}}{\omega}\right)^2$$

7. The oscillator circuit of claim 6 wherein:
the synchronizing signal source is an oscillator delivering a constant frequency output.

8. The oscillator circuit of claim 6 wherein:
the synchronizing signal source is an oscillator delivering a variable frequency output.

9. The oscillator circuit of claim 6 wherein:
all of the negative resistive elements are connected to a common tank circuit which constitutes the synchronizing signal source.

10. The oscillator circuit of claim 6 further comprising:
a separate diode connected to each of the second terminals of the negative resistance elements;
each of said diodes being normally non-conducting and being forward biased to become conducting by the driving pulses that periodically bias the successive negative resistance elements, whereby the output power of the succesively operated negative resistance elements is channeled to the load.

11. The oscillator circuit of claim 6 wherein:
the negative resistance elements are each bulk semiconductor diodes.

References Cited

UNITED STATES PATENTS 3,243,728 3/1966 Brainerd et al. ______ 331—117
3,243,729 3/1966 Olson et al. ________ 331—17

JOHN KOMINSKI, *Primary Examiner.*